United States Patent

[11] 3,582,727

[72] Inventors George Francis Granger
Kendall Park;
Heshmat Khajezadeh, Somerville, both of, N.J.
[21] Appl. No. 858,819
[22] Filed Sept. 17, 1969
[45] Patented June 1, 1971
[73] Assignee RCA Corporation

[54] HIGH VOLTAGE INTEGRATED CIRCUIT INCLUDING AN INVERSION CHANNEL
2 Claims, 3 Drawing Figs.

[52] U.S. Cl. .......... 317/235R, 317/234N, 317/235D, 317/235E, 317/235AH
[51] Int. Cl. .......... H01l 11/00, H01l 15/00
[50] Field of Search .......... 317/234, 235, 22, 22.1, 22.11, 48.1, 5, 5.2, 5.3, 5.4, 40, 40.1, 40.12, 40.13, 46, 46.1, 48, 48.4

[56] References Cited
UNITED STATES PATENTS
3,370,995 2/1968 Lowery et al. .......... 317/234
3,405,329 10/1968 Loro et al. .......... 317/235
3,518,506 6/1970 Gates .......... 317/234

OTHER REFERENCES
" IBM Technical Disclosure Bulletin" by Wiedmann et al. Vol. 11, No. 11, Apr. 1969, page 1601, copy in class 317/235/22.1

*Primary Examiner*—John W. Huckert
*Assistant Examiner*—Andrew J. James
*Attorney*—Glenn H. Bruestle

ABSTRACT: A body of semiconductor material has an isolation region of P-type conductivity which surrounds a plurality of zones of N-type conductivity. An insulating layer is disposed on the surface of the body. At least one of the N-type zones contains a region of P-type conductivity which is connected to a bonding pad on the surface of the insulating layer by means of an electrical lead. The electrical lead and the bonding pad are disposed on the insulating layer entirely within the area above the N-type zone containing the P-type region.

INVENTORS
GEORGE FRANCIS GRANGER &
HESHMAT KHAJEZADEH
BY [signature]
ATTORNEY

HIGH VOLTAGE INTEGRATED CIRCUIT INCLUDING AN INVERSION CHANNEL

Background of the Invention

This invention relates to integrated circuits, and more particularly to high voltage integrated circuit structures having an inversion channel in the semiconductor material under an electrical lead on the surface of the integrated circuit with an insulating layer in between.

An inversion channel of a first type conductivity will be formed in a body of semiconductor material of a second type conductivity adjacent a surface of the body having an electrical lead above it and with an insulating layer in between, when two conditions are met. First, a potential difference must exist between the electrical lead and the semiconductor material, where the polarity of the electrical lead is such that it will repel the major conductivity carrier and attract the minor conductivity carrier in the body of semiconductor material; thus, in a body of N-type conductivity, the lead must have a negative polarity with respect to the body of semiconductor material, so that the electrons are repelled and the holes are attracted to the lead. Second, the magnitude of this potential difference must be greater than some critical voltage which is dependent upon the fabrication characteristics of the integrated circuit. In particular, the voltage is dependent upon the thickness and dielectric constant of the insulating layer, the voltage drop across the insulating layer, and the doping level of the semiconductor material. At voltages less than the critical voltage, the electrical lead will repulse the major conductivity carriers and form a depletion region under the lead; but above the critical voltage the minority carriers will migrate toward the lead, and a region of the first type conductivity will form in the body of semiconductor material of the second type conductivity under and adjacent the lead. Thus, in a body of N-type conductivity with negative polarity on an electrical lead above its surface, an inversion channel of P-type conductivity will form adjacent the surface of the body, following the path of the electrical lead. In a typical integrated circuit, an inversion channel will form when the potential difference is in the order of about 20 volts.

An inversion channel will act as an electrical short in an integrated circuit under certain circumstances which are dependent upon the type and structure of the integrated circuit employed. Heretofore, many integrated circuits have used P-N junction isolation to divide the circuit up into a number of zones of semiconductor material which are electrically isolated from the remainder of the circuit. An isolation region of a first type conductivity surrounds each zone of a second type conductivity, and thus separates each zone from the remainder of the integrated circuit by a P-N junction having a relatively high breakdown voltage. The zones usually contain one or more electrical devices which need to be electrically isolated from the remainder of the circuit.

To insure the electrical isolation of these devices, the bonding pads, which connect the circuit with the outside world, have been separated from the zones containing the devices. The bonding pads have been disposed on an insulating layer on the surface of the semiconductor material in areas which were not above the zones containing the devices. In the past, the bonding pads have had a tendency to spike through the insulating layer and make a direct connection to the semiconductor material below when they were connected to the outside world. In particular, this has been true when thermocompression bonding techniques were used to fasten a lead wire to the bonding pad. B By placing the bonding pad in areas which are not above the zone containing the device, the devices are not endangered if the bonding pad does spike through the insulating material. Usually, the bonding pads have been placed above separate zones which did not contain any devices, so that the bonding pads were also isolated from the remainder of the circuit; and the circuit was not endangered even if the bonding pad did spike through the insulating layer to the semiconductor material below. Although this type of integrated circuit is sufficient for many uses, it is not adequate in certain inversion channel situations.

It has now been found that an inversion channel will short an electrical device within a zone to the surrounding isolation region when certain structural conditions are met. First, the device must contain a region of the same first type conductivity as the isolation region; and second, the device region must be connected to a bonding pad outside the device zone by an electrical lead on the surface of the insulating layer. Under the proper voltage and bias conditions, an inversion channel of the first type conductivity will form in the zone under the metallized lead. The inversion channel follows the metallized lead, and it is connected at one end to the device region of the first type conductivity, and at the other end to the isolation region of the same first type conductivity. Thus, the inversion channel connects the two regions of the same first type conductivity and results in shorting the device to the isolation region and the substrate below.

Summary of the Invention

In the present integrated circuit, the bonding pad and the metallized lead are disposed on the insulating layer entirely within the area above the zone containing the device to be isolated. Although the inversion channel remains under the bonding pad and the metallized lead, the inversion channel does not extend to the edge of the zone, and is not connected to the isolation region surrounding the zone. Consequently, the inversion channel does not complete the short circuit between the two regions of the same first type conductivity.

The Drawings

Description of the Preferred Embodiments

Figure 1:
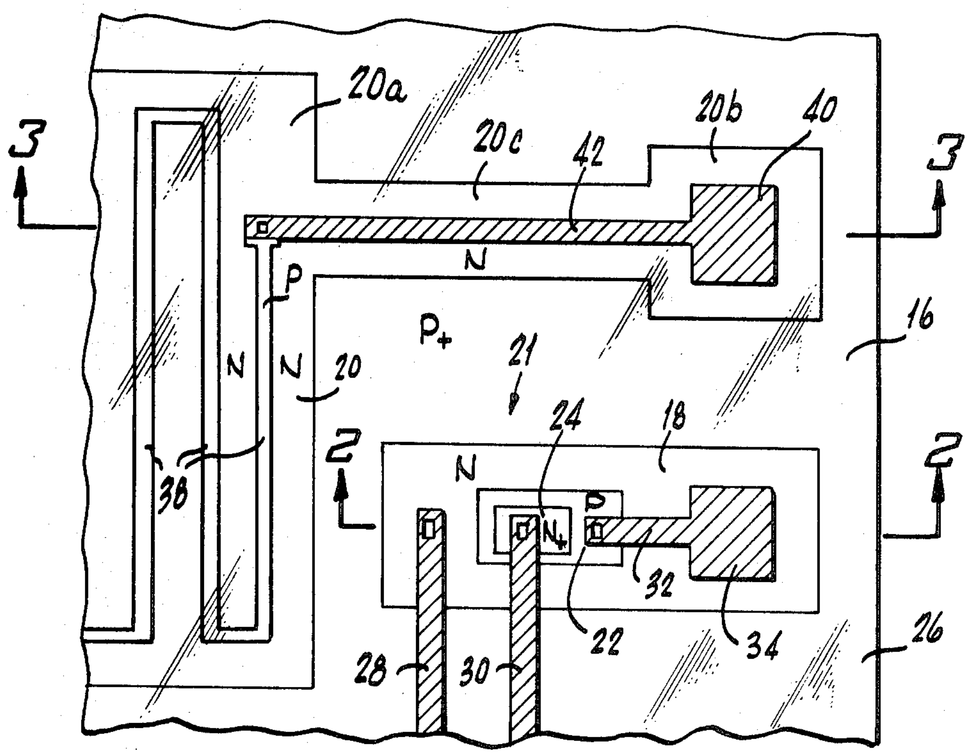
FIG. 1 is a top view of a part of a typical integrated circuit which includes two embodiments of the present invention.
Figure 2:
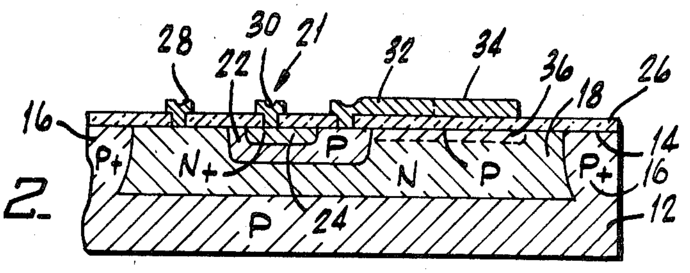
FIG. 2 is a cross-sectional view of a part of the integrated circuit taken along the line 2–2 of FIG. 1.
Figure 3:
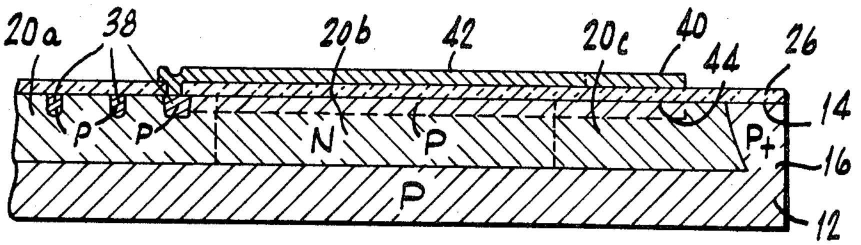
FIG. 3 is a cross-sectional view of a part of the integrated circuit taken along the line 3–3 of FIG. 1.

FIGS. 1—3 are top and cross-sectional views of a part of a typical integrated circuit which includes two embodiments of the present invention. The integrated circuit comprises a substrate 12 of a first type conductivity and an epitaxial layer of a second type conductivity having a surface 14. An isolation region 16 of the first type conductivity is diffused through portions of the epitaxial layer to divide the layer up into a number of zones, 18 and 20, of the second type conductivity. The zones 18 and 20 are surrounded by regions of the first type conductivity with a P-N junction in between. The P-N junction has a relatively high breakdown voltage, and it serves to electrically isolate the zones 18 and 20 from the remainder of the circuit. In the present circuit, the zones 18 and 20 are of N type conductivity and are surrounded by the isolation region 16 and the substrate 12 of P type conductivity; and the zones 18 and 20 have a P-N junction isolation breakdown of about 90 volts.

FIG. 2 is a cross-sectional view of a part of the integrated circuit which includes one embodiment of the present invention. The cross-sectional view is taken along the line 2–2 2 of FIG. 1, and it intersects the zone 18 and part of the surrounding isolation region 16. The zone 18 includes an electrical device which is to be electrically isolated from the remainder of the integrated circuit. In FIG. 2, the device is a typical NPN transistor 21. The transistor 21 comprises part of the zone 18 of the second type conductivity for the collector, a first region 22 of the first type of conductivity for the base, and a second region 24 of the second type conductivity for the emitter. An insulating layer 26 is disposed on the surface 14 of the epitaxial layer and is selectively opened up to expose a portion of the second 24, first 22, and zone 18 regions of the transistor 21. A highly conductive material, such as aluminum, is then disposed upon the insulating layer and selectively removed to produce the electrical leads 28, 30 and 32 which serve to connect the three regions of the transistor 21 with other parts of the circuit.

A bonding pad 34 is also disposed on the insulating layer 26 and is connected to the first region 22 of the first type conductivity by means of the electrical lead 32. The metallized lead 32 and the bonding pad 34 are disposed on the surface of the insulating layer 26 entirely within the area above the zone 18. In the present integrated circuit, the bonding pad 34 is usually formed at the same time as the metallized leads by the vacuum deposition of an aluminum film; however, this invention is not limited to any particular type of bonding pad, and it also applies to other types of bonding pads such as those in beam-lead and flip-chip integrated circuits.

Under the proper voltage and bias conditions an inversion channel 36 will form in the zone 18 adjacent the surface 14 in the area under the metallized lead 32 and the bonding pad 34. In the present circuit, an inversion channel 36 of P-type conductivity will form in the zone 18 of N-type conductivity at a potential difference of about 20 volts. As shown in FIG. 2, the P-type inversion channel 36 intersects the first region 22, which is also of P-type conductivity; and in effect, extends the first region 22 to the end of the inversion channel 36. However, the inversion channel 36 does not extend to the edge of the zone 18 and does not intersect the surrounding P-type isolation region 16, because the metallized lead 32 and the bonding pad 34 are disposed on the surface of the insulating layer 26 entirely within the area above the zone 18. Consequently, the inversion channel 36 does not connect the first region 22 with the isolation region 16, and it does not result in shorting the transistor 21 to the isolation region 16 and the substrate 12 below.

In the present integrated circuit structure, care should be taken to make sure that the bonding pad 34 does not spike through the insulating layer 26; however, this can be done with little additional effort, while the inversion channel short in the prior art integrated circuits cannot be corrected since the bonding pad 34 is placed outside of the zone 18.

FIG. 3 is a cross-sectional view of another part of the integrated circuit which includes a second embodiment of the present invention. The cross-sectional view is taken along the line 3–3 of FIG. 1, and it intersects the zone 20 and another part of the surrounding isolation region 16. In this embodiment, the zone 20 includes a resistor 38 which is made by diffusing a region of the first type conductivity into a part of the zone 20 from the surface 14. Another part of the insulating layer 26 is selectively opened up to expose a portion of the resistor 38. A bonding pad 40 and an electrical lead 42 are disposed upon the surface of the insulating layer 26 and connected to the resistor 38. It should be pointed out, that this invention is not limited to transistors and resistors, but is applicable to all situations where a bonding pad is connected to a region of the first type conductivity within a zone of the second type conductivity.

As shown in FIG. 1, it is sometimes necessary to connect the bonding pad to a device which is not located near one of the edges of the circuit. Since it is generally beneficial to place the bonding pads around the edges of the circuit, an extended electrical lead 42 must be used to connect the bonding pad 40 to the resistor 38. To prevent an inversion channel short in such situations, the zone 20 must be extended towards the edge of the circuit to include the electrical lead 42 and bonding pad 40. In this embodiment, the zone 20 includes two major portions **20*a* and 20*b* and a connecting portion 20*c*. The major portion 20*a* contains the resistor 38 and any other devices which are desired, depending upon the type of circuit selected. The other major portion 20*b* does not contain any devices, but it is situated under the bonding pad 40. The connecting portion 20*c* also does not contain any devices, and it is situated under the electrical lead 40. As a result, the bonding pad 40 and the metallized lead 42 are disposed on the insulating layer 26 entirely within the area above the zone 20**.

As shown in FIG. 3, an inversion channel 44 will form under the lead 42 and the pad 40; however, the channel 44 is not connected to the isolation region 16, and it does not short the resistor 38 to the substrate 12 below.

We claim:

1. A microcircuit comprising:

a body of semiconductor material having a surface;

b. said body having an isolation region of a first type conductivity adjacent said surface, and a plurality of zones of a second type conductivity adjacent said surface, where each of said zones is surrounded by said isolation region and separated by a P-N junction;

c. one of said zones having a first region of the first type conductivity adjacent said surface;

d. an insulating layer disposed on said surface of said body;

e. a bonding pad disposed on said layer;

f. an electrical lead disposed on said layer, said lead connected to said first region and connected to said pad;

g. said pad and said lead disposed entirely within the area above said one zone whereby when a conducting channel of the first type conductivity is induced at said surface of said one zone under said pad and said lead, said channel is not connected to said isolation region and does not short said first region to said isolation region.

2. A microcircuit as in claim 1 where said one zone comprises a first major portion which contains said first region, a second major portion which is disposed under said bonding pad and has a sufficient size and shape such that said bonding pad is disposed on said insulating area entirely within the area above said second portion, and a connection portion which is disposed under said electrical lead and has a sufficient size and shape such that the metallized lead is disposed on said insulating layer entirely within the area above said connecting portion.